United States Patent
Lawas et al.

(10) Patent No.: US 7,679,445 B2
(45) Date of Patent: Mar. 16, 2010

(54) INDEPENDENT DOMINANT POLE COMPENSATION OF TWO LOOPS USING ONE COMPENSATING ELEMENT

(75) Inventors: Kenneth A. Lawas, Kensington, NH (US); Kimo Y. F. Tam, Lincoln, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 12/024,686

(22) Filed: Feb. 1, 2008

(65) Prior Publication Data

US 2009/0195311 A1 Aug. 6, 2009

(51) Int. Cl.
*H03F 3/45* (2006.01)

(52) U.S. Cl. .................. 330/260; 330/253; 330/292
(58) Field of Classification Search ............... 330/252, 330/253, 260, 292
See application file for complete search history.

(56) References Cited

U.S. PATENT DOCUMENTS 7,453,319 B2 * 11/2008 Gupta et al. ............ 330/253

* cited by examiner

*Primary Examiner*—Khanh V Nguyen
(74) *Attorney, Agent, or Firm*—Kenyon & Kenyon LLP

(57) ABSTRACT

Disclosed is a differential amplifier system that maintains high speed characteristics of the differential amplifier while providing stability from a common-mode loop by using dominant pole compensation. The disclosed system includes a first and second transconductance stage, a circuit having high impedance, and a compensation circuit.

23 Claims, 3 Drawing Sheets

INDEPENDENT DOMINANT POLE COMPENSATION OF TWO LOOPS USING ONE COMPENSATING ELEMENT

BACKGROUND

Differential amplifiers are used for many different applications. Differential amplifiers are used for signal transmission, such as differential analog crosspoint switches. A differential amplifier generates an output voltage that is proportional to the difference between voltages present on a pair of inputs. Often, the output can be a differential signal, for example a differential voltage signal or a differential current signal. In many applications, the differential input signal is a time varying signal and the differential amplifier circuit must generate a corresponding time varying output rapidly.

The performance of differential amplifiers often is discussed in the context of two different properties. The first property being the differential output of the differential amplifier. Generally, it is desirable to have the differential output to be an accurate representation of the differences between the signals applied to the inputs, and to have the difference amplified by a stable gain. It is further desirable for the response of the differential amplifier to be rapid with respect to fluctuations in the input signals. The second property being a common mode in which it is desirable to maintain the operation of the circuit devices within their linear operating range. This allows the average of differential output signals to remain at some predetermined level with relatively low fluctuation.

A goal of the present invention is to maintain the high speed characteristics of a differential amplifier while providing stability from a common-mode loop by using dominant-pole compensation. This is accomplished by multiplying the current in a compensation circuit from the common-mode feedback loop without multiplying the current from the differential feedback loop.

DETAILED DESCRIPTION

Figure 1:
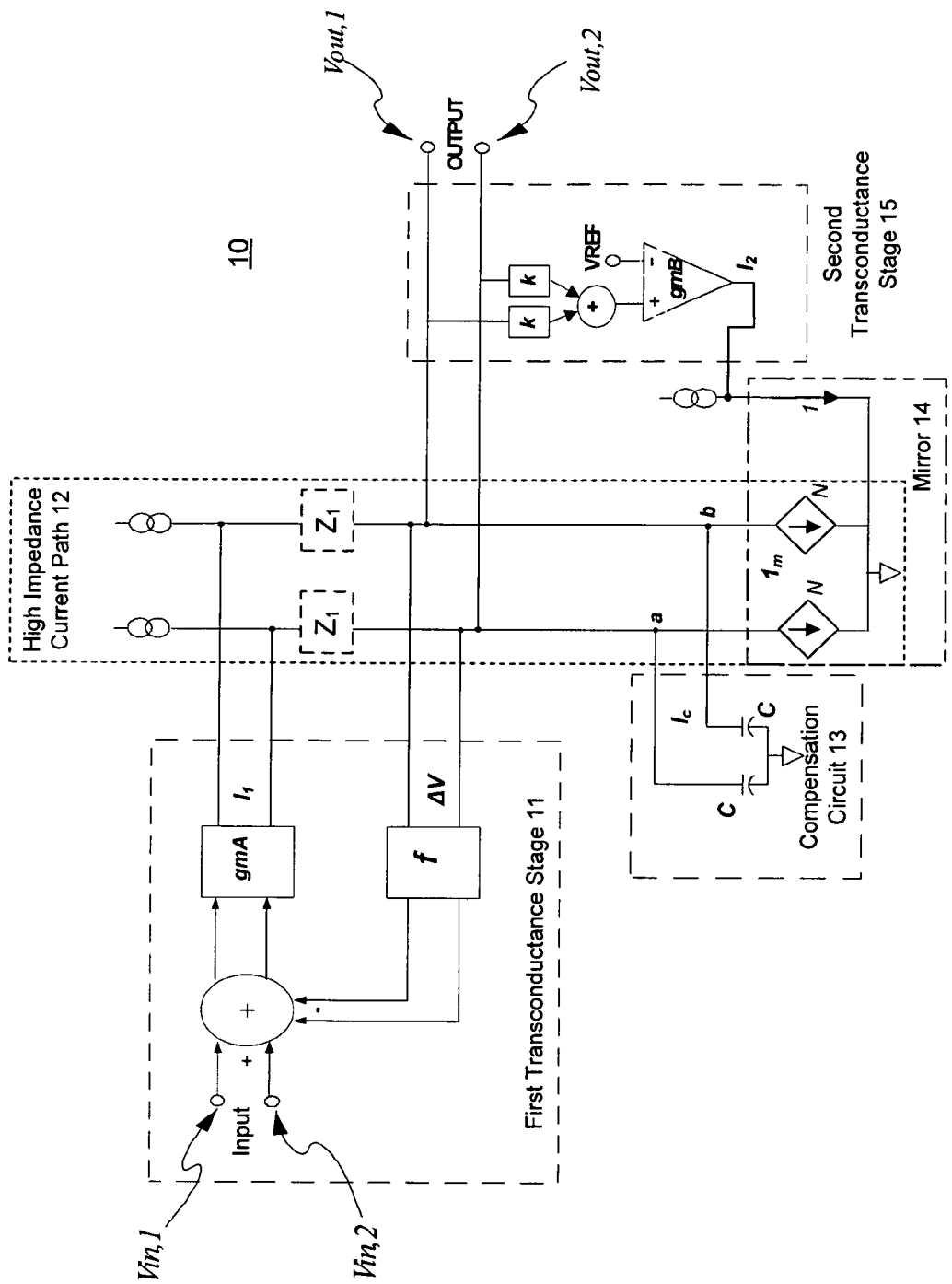
FIG. 1 illustrates a differential amplifier system according to an embodiment of the present invention.

Embodiments of the present invention relate to a differential amplifier circuit including a common mode feedback circuit and compensation circuit. To overcome the above problems, a differential amplifier circuit is implemented using a pair of high impedance current paths having first nodes for receiving signals. The high impedance current paths provide large changes in voltage for small changes in current along the current path. Current sinks can be included on the high impedance current paths to maintain the balance of current on the current paths. A first transconductance stage can include a first transconductance amplifier and a second transconductance amplifier. The first transconductance amplifier receives input voltages and generates a differential current that is input into the first nodes of the high impedance current paths. The second transconductance amplifier can have inputs connected to second nodes of the high impedance current paths, and outputs connected to the outputs of the first transconductance amplifier. The second nodes of the high impedance current paths are system outputs. The differential amplifier circuit also comprises a second transconductance stage for averaging the voltage signals on the system outputs and comparing the average to a reference voltage. Based on the comparison, a current is generated that is input into each of the current sinks on the high impedance current path. A compensation circuit having capacitive elements is connected to the system output terminals FIG. 1 illustrates a differential amplifier system according to an embodiment of the present invention. The differential amplifier system 10 includes a first transconductance stage 11, a high impedance circuit 12, a compensation circuit 13, and a second transconductance stage 15. The differential amplifier system 10 has inputs $V_{in,1}$ and $V_{in,2}$, which are coupled to the first transconductance stage 11, and outputs $V_{out1}$ and $V_{out,2}$. The difference in voltage between $V_{out,1}$ and $V_{out,2}$ is proportional to the difference in voltage between $V_{in,1}$ and $V_{in,2}$.

The first transconductance stage 10 may include a transconductance device gmA, and a differential voltage feedback device f. The input voltage can be either single ended or differential. If single ended either of inputs $V_{in,1}$ or $V_{in,2}$ can be a ground depending upon the desired output. A differential output current $I_1$ generated by transconductance device gmA may be output to the high impedance current path 12. The inputs to the differential voltage feedback f are taken from nodes on the high impedance current path 12, for example, of the differential amplifier system output nodes $V_{out,1}$ and $V_{out,2}$. The differential voltage feedback f senses a differential voltage $\Delta V$ on the nodes of the high impedance current path 12 and feeds back the voltage difference. At equilibrium, the feedback voltage from the differential voltage feedback device f sums with the input voltage $V_{in,1}$ and $V_{in,2}$ to zero.

In an embodiment, the first transconductance stage can be implemented as described in U.S. patent application Ser. No. 11/818,739, filed Jun. 15, 2007, entitled "Balanced Differential Cross-coupler Transconductance Amplifier for a Multiplexer", the content of which is incorporated herein in its entirety.

The high impedance circuit 12 provides two differential, high impedance conductive paths to which the remaining components are connected. The high impedance circuit 12 may include several pairs of high impedance elements $Z_1$, including pairs of nodes for attachment of the first transconductance stage 11, output terminals $V_{out,1}$ and $V_{out,2}$ and the compensation circuit 13. The impedances $Z_1$ can be any number and type of devices, such as resistors or transistors, that provide a high impedance. The locations of impedance elements $Z_1$ are optional.

The second transconductance stage 15 comprises a differential input voltage $V_{out,1}$ and $V_{out,2}$, means of computing an average or scaled summation representing a common-mode voltage of the inputs including scalars k, and a transconductance device gmB that generates a current output $I_2$ proportional to the difference between common-mode voltage and a reference voltage. The means of computing can be any device or configuration of devices that provides the above described functions.

The mirror 14 injects current into the high impedance current path 12 based on a common mode voltage input into the second transconductance stage 15. To provide the proper functionality, the mirror 14 can have an input terminal, and two matched output terminals such that current I injected from the second transconductance stage 15 will be scaled by N and returned in equal amounts to the high impedance nodes on each of the high impedance current paths. The mirror 14 can be constructed in a variety of configurations from various components to provide the described functionality. The mirror 14 can incorporate components of the high impedance current path 12. It may contain emitter degeneration resistors in which case a mirror ratio will not only depend on transistor sizing but also on resistor sizing. It could contain base resistance. The mirror 14 may also contain active buffering elements, or active feedback elements, base-current compensation or DC-bias adjustments, some of which may be components of the high impedance current path 12.

The compensation circuit 13 compensates both a differential mode and a common mode of the differential amplifier system 10. The compensation circuit 13 comprises capacitive elements C that reduce impedance in the high impedance current paths 12 based on the frequency. The benefits and function of the compensation circuit 13 will be described in more detail below with reference to the exemplary embodiments.

The circuit has two concurrent modes: a differential feedback mode and a common-mode with feedback. In differential mode operation, the first transconductance stage 11 converts the differential input voltages $V_{out,1}$ and $V_{out,2}$ into differential currents $I_1$ that are proportional to the difference between $V_{out,1}$ and $V_{out,2}$. The differential currents $I_1$ are input into the high impedance current paths 12, which cause a differential voltage to appear at the outputs $V_{out,1}$ and $V_{out,2}$. The first transconductance stage 11 also senses the differential output voltages V as feedback. The compensation circuit 13 minimizes the high frequency gain in the differential mode by reducing impedance in the high frequency current paths 12. In common mode, the second transconductance stage 15 prevents common mode voltage from drifting outside the operating range of the devices forming the system 10. The second transconductance stage 15 senses output voltages $V_{out,1}$ and $V_{out,2}$ which are operated on by scalar k and a summation block. This computation can be performed elsewhere and provided to the second transconductance stage 15. The output from the summation is compared to a reference. Based on the reference, current $I_2$ is fed to the current mirror 14. The current mirror 14 comprises elements of the high impedance current path 12, and acts to inject current $I_m$ into the high impedance current path 12 to maintain the common mode at a reasonable level. In common-mode, the compensation circuit 13 sends current $I_c$ to ground.

Figure 2:
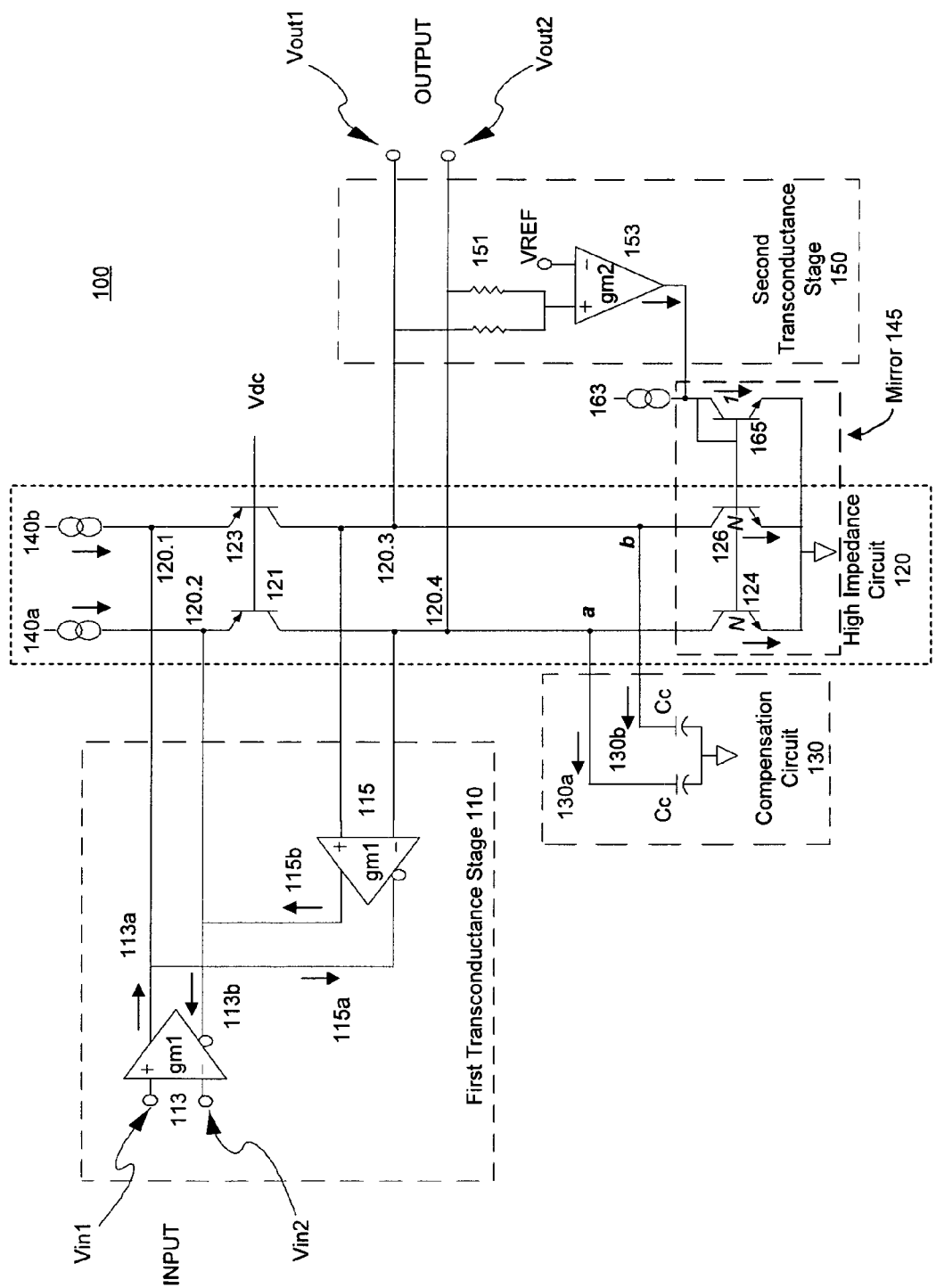
FIG. 2 illustrates a differential amplifier circuit according to another exemplary embodiment of the present invention.

FIG. 2 illustrates a differential amplifier system 100 according to an embodiment of the present invention. The differential amplifier system 100 includes a first transconductance stage 110, a high impedance circuit 120, a compensation circuit 130, and a second transconductance stage 150. The differential amplifier system 100 has inputs $V_{in1}$ and $V_{in2}$, which are coupled to the first transconductance stage 110, and outputs $V_{out1}$ and $V_{out2}$. The difference in voltage between $V_{out1}$ and $V_{out2}$ is proportional to the difference in voltage between $V_{in1}$ and $V_{in2}$.

The high impedance circuit 120 provides two differential, high impedance conductive paths to which the remaining components are connected. For example, the first transconductance stage 110 has differential outputs that are coupled to respective first nodes 120.1, 120.2 within the high impedance circuit 120. System outputs $V_{out1}$ and $V_{out2}$ are coupled to a second set of nodes 120.3, 120.4, respectively, within the high impedance circuit 120. The high impedance circuit 120 may include impedance elements 121, 123, 124 and 126. During operation, as the first transconductance stage 110 introduces differential currents to nodes 120.1 and 120.2, it introduces corresponding differential voltage swings at the output nodes $V_{out1}$ and $V_{out2}$. By tuning the impedance of the elements 121, 123, 124 and 126, relatively small current changes can introduce large differential signals at the second set of nodes 120.3, 120.4.

The first transconductance stage 110 may include a pair of differential transconductance amplifiers 113, 115. A first transconductance amplifier 113 may generate differential currents 113a, 113b based on a potential difference between input terminals $V_{in1}$ and $V_{in2}$. The first transconductance amplifier 113 output also is differential, so current 113a is equal and opposite to current 113b. Currents 113a and 113b are injected into the high impedance circuit 120 at nodes 120.1, 120.2, are summed with currents supplied from the current sources 140b, 140a and pass through the transistors 126, 124. The summed currents passing through transistors 124, 126 define potentials at nodes 120.3, 120.4 (the output nodes of the circuit). Because the current contributions of 113a and 113b are equal and opposite, they cause equal and opposite changes to the voltages at the output nodes in response to voltage changes at $V_{in1}$ and $V_{in2}$.

The second transconductance amplifier 115 forms a feedback path within the first transconductance stage 110 to keep the stage 120 operating at equilibrium. The second transconductance amplifier 115 may have inputs connected to the output nodes 120.4, 120.3 (nodes a and b). It may generate differential currents 115b and 115a based on the voltage difference between node a and b. Current 115a combines with current 113a, and current 115b combines with current 113b. At equilibrium, as differential voltages occur at nodes a and b, the second transconductance amplifier 115 generates counteracting currents 115a, 115b that cancel currents 113a, 113b, respectively, generated by the transconductance amplifier 113. This stops the change in differential output in which case the output voltage matches the input voltage.

The differential amplifier system 100 also may include a second transconductance stage 150. In an embodiment, the second transconductance stage includes a voltage divider 151 and a third transconductance amplifier 153. The voltage divider 151 may generate a potential representing a common mode of the differential output $V_{out1}$ and $V_{out2}$. Often, the common mode represents an average of the two output voltages, which could be obtained for example by using a balanced, resistor-based voltage divider. The common mode voltage is input to the third transconductance amplifier 153 at a first input, and a reference voltage (VREF), representing an acceptable common mode voltage level, is input to a second input of the third transconductance amplifier 153. The third transconductance amplifier 153 may generate a current representing a difference between the actual and acceptable common mode levels.

The common mode control circuit 150 may be connected to a current mirror system comprised of a first transistor 165 and including the high impedance elements 124 and 126. Responsive to the current generated by the third transconductance amplifier 153, the impedance of the high impedance elements 124, 126 may change in a manner to either raise or lower the common mode value of $V_{out1}$ and $V_{out2}$ in a manner that returns the common mode value to a nominal level.

For example, where the high impedance circuit 120 is configured as a folded cascode 120, the high impedance elements 124, 126 may be bipolar junction transistors. Transistor 165 coupled with transistors 124 and 126 may be configured as a current mirror. Based on the control current from the third transconductance amplifier 153, impedance of the transistors 124, 126 rises or falls jointly. Although changes in voltage at the output nodes $V_{out1}$, $V_{out2}$ may continue to operate as differential signals, common mode components of these voltages may rise and fall together as needed to retain the common mode value at nominal. Thus, as the average value of $V_{out1}$ and $V_{out2}$ deviates from VREF, the current mirror causes counteracting currents to be applied to both impedance elements 124 and 126 to return the average of $V_{out1}$ and $V_{out2}$ to nominal.

When the average of $V_{out1}$ and $V_{out2}$ is equal to VREF, transconductance amplifier 153 does not generate current. But the current from current source 163 provides current to impedance elements 124 and 126 to balance the current provided by current sources 140a and 140b, respectively.

The differential amplifier system 100 also may include a compensation circuit 130. As illustrated in FIG. 2, the compensation circuit 130 is shown comprising a pair of capacitors each coupling a respective output terminal $V_{out1}$, $V_{out2}$ to ground. Alternatively, in place of capacitors, other electronic devices, such as transistors or diodes, can be used because of their properties of varying capacitance with voltage (varactor). Alternatively, the capacitors can be networks that include series or parallel resistances.

The control circuit 130 has roles both in a differential mode compensation and a common mode compensation. When compensating the differential mode, the compensation circuit 130 stabilizes the first transconductance stage 110 by minimizing it's high frequency gain. At low frequencies, the capacitive elements Cc appear as an open circuit and minimal current passes. However, at high frequencies, the capacitive elements Cc appear to be short circuits and larger amounts of current passes. The capacitance properties of the capacitive elements minimize the high-frequency gain (noise gain) of the first transconductance 110 by reducing the impedance at nodes a and b. The details of the differential mode compensation will be explained in more detail with respect to FIG. 3.

When compensating the common mode, the compensation circuit 130 stabilizes the second transconductance stage 150 to prevent oscillation. To compensate the second transconductance stage 150, the compensation circuit 130 diverts currents 130a and 130b to ground. Currents 130a and 130b are a portion of the current generated by transconductance amplifier 153, and are equal and of the same polarity.

The compensation circuit 130 also serves to force the first transconductance stage 110 and the second transconductance stage 150 to cross-over their unity gain frequencies at a lower frequency. The cross over frequencies of both the first transconductance stage 110 and second transconductance stage 150 can be adjusted by changes in capacitive elements Cc of the compensating circuit 130. The open-loop gain of first transconductance stage 110 cross-over frequency is determined by the relationship of gm1/Cc, where gm1 is the transconductance of first transconductance stage 110. The open-loop gain of second transconductance stage 150 cross-over frequency is determined by the relationship of gm2/Cc, where gm2 is the transconductance of second transconductance stage 150.

The cross-over frequencies of the first transconductance stage 110 and the second transconductance stage 150 can also be adjusted by degeneration of the transconductance (gm1 or gm2). It is preferable that the degeneration of the transconductance gm1 be dictated by the desired linear input range and the necessary slew rate of the differential amplifier system 100. The degeneration of transconductance gm2 is largely dictated by necessary common-mode output range. Further degenerating the gm1 and gm2 transconductance in order to stabilize the circuit can reduce output accuracy, increase input-referred noise, and increase offset voltage, which can be undesirable. A solution is desired in which the gm1 and gm2 transconductance can be independently set, and the crossover frequencies of the first transconductance stage and second transconductance stage can be set for stability with the remaining parameter: Cc.

Figure 3:
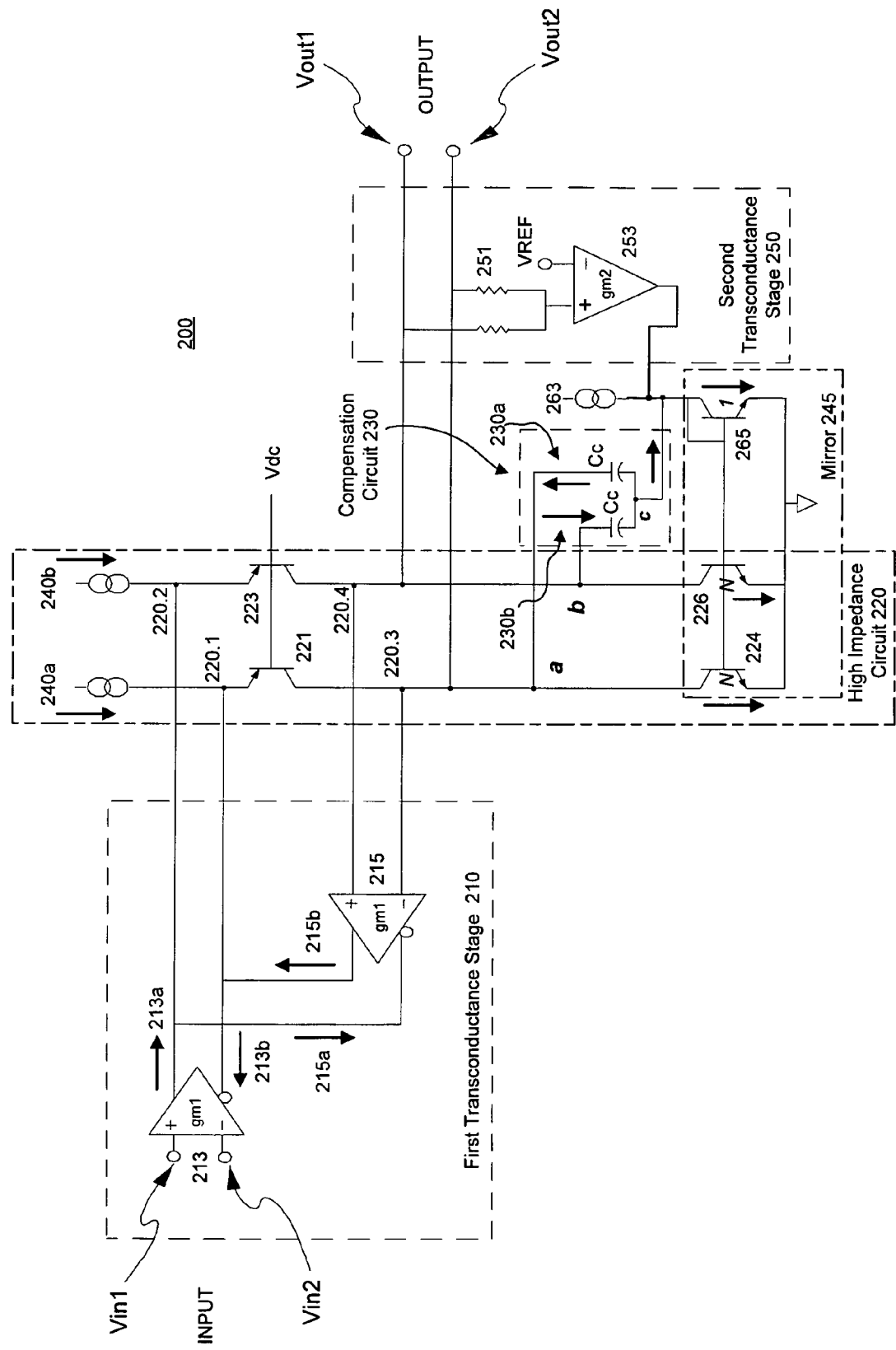
FIG. 3 illustrates a differential amplifier circuit according to yet another exemplary embodiment of the present invention.

To accomplish the above solution, another embodiment of the compensation circuit 130 can be used. FIG. 3 illustrates another embodiment of the present invention in which the compensation circuit 130 is connected differently. In the differential amplifier system 200, the first transconductance stage 210 is the same as first transconductance stage 110 shown in FIG. 2, as are current sources 240a, 240b and common-mode circuit 250. The second transconductance stage 250 performs the same functions as second transconductance stage 150. Generally, the compensation circuit 230 performs the same compensation functions as compensation circuit 130.

The compensation circuit 230 again has roles both in a differential mode compensation and a common mode compensation. To provide differential mode compensation to the first transconductance stage 210, compensation circuit 230 comprises two capacitive elements Cc, one for node a and one for node b, the return of the compensation circuit 230 is connected to node c. Differential current contributions from first conductance stage 210 on nodes a and b will drive currents 230a and 230b through the capacitive elements Cc that are equal, but out of phase.

Currents 230a and 230b will sum in node c such that there is no net change in current into node c. As such, there is no change in voltage at node c, so it is a "virtual ground" with respect to the differential signal. The first conductance stage 210 is still compensated to the cross-over frequency characterized by gm1/Cc.

To provide common mode compensation to the second transconductance stage 250, the currents through each capacitive element Cc are equal and in phase, and sum constructively to change the current in node c. By way of example, with a 1:1 current mirror ratio, the common-mode displacement current is twice that of the common-mode displacement current of second transconductance stage 150. In FIG. 3, the current is displaced once through the compensation circuit 230 and again through the current mirror comprising transistor 265 and including impedance elements 224 and 226.

The cross-over frequency of the first transconductance stage is still characterized by gm1/Cc. However, the crossover frequency of the second transconductance stage 250 is characterized by gm2/[2*Cc]. The 1:1 current mirror effectively doubles the capacitance, adding a degree of freedom such that the lower speed second transconductance stage 250 can be compensated with a lower cross-over frequency than the faster first transconductance stage 210. To function, the mirror 245 can have an input terminal, and two matched output terminals such that difference current summed from the compensation network 230 into the input terminal will be scaled and returned in equal amounts to the to high impedance nodes.

Referring back to FIG. 2, when the high impedance circuit 120 is implemented using transistors as impedance elements 124 and 126, the current generated by the current mirror is dictated by the sizing of the transistor 165 and transistors 124 and 126. For example, transistors 124 and 126 can have a value 1 and transistor 165 can have a value N. The current mirror would have a mirror ratio of N based on the transistor sizing (1:N). This provides additional design freedom in FIG. 2, which can be obtained by adjusting the mirror ratio N of the current mirror. In this case, the crossover frequency of the second transconductance stage 150 is (N×gm2)/Cc, while the crossover frequency of the first transconductance stage 110 remains at gm1/Cc. This offers additional flexibility in degeneration of the second stage transconductance gm2. But in this case, the often slower second transconductance stage 150 has its crossover frequency pushed out in frequency, potentially becoming instable for values of Cc that satisfy the requirements of the first transconductance stage 110. By connecting the compensation network as shown in FIG. 3, the crossover frequency of the second transconductance stage 250 is again reduced, this time to [(N×gm2)/(N+1)Cc]. It can be shown that for any value of N, the system of FIG. 3 provides a lower second transconductance stage crossover frequency than the system of FIG. 2. The system of FIG. 3 can allow a smaller Cc value to be used.

As mentioned above, the current mirror of FIG. 3 also has a mirror ratio of N. A current mirror using the above described bipolar junction transistors will not have the current gain of a transistor (beta, or approximately 100). But for other transconductance devices, such as MOSFETs, the mirror ratios could be larger. Increasing the current mirror ratio, increases the displacement current. In the small signal analysis, this effectively multiplies the capacitive elements Cc by (N+1), where N is the mirror ratio. Values of N less than approximately 10 allow the second transconductance stage to operate at lower currents and subsequently lower power.

Those skilled in the art can appreciate from the foregoing description that the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

What is claimed is:

1. A differential amplifier system, comprising:
   a pair of high impedance current paths including system outputs;
   a first transconductance stage having an input, having outputs connected to respective first nodes of each of the pair of high impedance current paths, and having inputs for differential voltage signals from respective second nodes of each of the high impedance current paths;
   a second transconductance stage having inputs for an approximate average of the system outputs and for a reference voltage and having an output for a current generated therefrom, the generated current input into each of the high impedance current paths; and
   a compensation circuit comprising capacitive elements connected to the pair of high impedance current paths and connected to the output of the second transconductance stage the capacitive elements having a value.

2. The system of claim 1, the first transconductance stage comprising:
   a first transconductance amplifier having inputs for differential voltage signals and having outputs for a pair of differential current signals generated from the inputs, the outputs connected to the respective first nodes of each of the high impedance current paths.

3. The system of claim 2, the first transconductance stage further comprising:
   a second transconductance amplifier having the inputs for the differential voltage signals and having outputs for a pair of differential current signals connected to respective outputs of the first transconductance amplifier, wherein inputs of the second transconductance amplifier are outputs for the differential amplifier system.

4. The system of claim 1, comprising a current mirror formed by an electronic device connected to the second transconductance stage and to each of the high impedance current paths, the current mirror having a mirror ratio N.

5. The system of claim 4, wherein sizing of the devices forming the high impedance current paths and of the device connected to the second transconductance stage sets the mirror ratio N of the current mirror.

6. The system of claim 1, wherein a transconductance of the first transconductance stage is different from a transconductance of the second transconductance stage.

7. The system of claim 1, wherein the pair of high impedance current paths has a plurality of high impedance elements, and the outputs for the differential amplifier system being connected between at least two of the high impedance elements on each of the pair of high impedance current paths.

8. The system of claim 4, wherein the compensation circuit provides a current that multiplies the value of the capacitive element by a factor of N+1, where N is a mirror ratio.

9. The system of claim 1, wherein the first transconductance stage controls differential-mode operation of the differential amplifier system.

10. The system of claim 1, wherein the second transconductance stage controls common-mode operation of the differential amplifier system and the compensation circuit provides a current that multiplies the value of the capacitive element during common mode operation by a factor of N+1, where N is a mirror ratio.

11. The system of claim 1, wherein the high impedance current path is formed from transistors.

12. The system of claim 1, wherein the high impedance current path is formed from a resistor network.

13. The system of claim 1, wherein the compensation circuit is formed from capacitors.

14. The system of claim 1, wherein the compensation circuit is formed from varactors.

15. A differential amplifier system, comprising:
   a pair of high impedance current paths;
   a first transconductance stage comprising:
      a first transconductance amplifier having inputs for differential voltage signals and having outputs for a pair of differential current signals generated from the inputs, the outputs connected to respective first nodes of each of the high impedance current paths, and
      inputs connected to the high impedance current paths for feeding back differential voltage signals form each of the pair of high impedance currents paths;
   a second transconductance stage having inputs for an average of the differential amplifier system outputs and for a reference voltage and having an output for a current generated therefrom, the generated current input into each of the high impedance current paths; and
   a compensation circuit comprising capacitive elements connected to the differential amplifier system output terminals and connected to ground, the capacitive elements having a value.

16. The system of claim 15, wherein the pair of high impedance current paths has a plurality of high impedance elements, and the outputs for the differential amplifier system being connected between at least two of the high impedance elements of each of the pair of high impedance current paths.

17. The system of claim 15, wherein the first transconductance stage is a differential amplifier circuit with feedback.

18. The system of claim 15, wherein the second transconductance stage is a common-mode circuit with feedback.

19. The system of claim 15, wherein the high impedance current path is formed from transistors.

20. The system of claim 15, wherein the high impedance current path is formed from a resistor network.

21. A method of compensating a differential amplifier system, comprising:
  inputting first differential voltage signals into a first transconductance amplifier of a first transconductance stage;
  outputting from the first transconductance amplifier a pair of differential current signals to respective first nodes of a pair of high impedance current paths;
  inputting second differential voltage signals into a second transconductance amplifier of the first transconductance stage connected to respective second nodes of each of the pair of high impedance current paths;
  outputting a second pair of differential current signals to respective outputs of the first transconductance amplifier, wherein inputs of the second transconductance amplifier are system outputs for the differential amplifier system;
  averaging the system outputs for input into a second transconductance stage;
  comparing, at the second transconductance stage, the average system outputs to a reference voltage;
  generating a current by the second transconductance stage based on the difference of the system average from the reference voltage;
  outputting the generated current into each of the high impedance current paths; and
  compensating the differential amplifier system by connecting capacitive elements to the system output terminals and to the output of the second transconductance stage.

22. The method of claim 21, comprising:
  after the generating a current by the second transconductance stage, increasing the generated current due to the mirror ratio of a current mirror connected to the first nodes of the pair of high impedance current paths and the second transconductance stage.

23. A differential amplifier system, comprising:
  a pair of high impedance current paths including system outputs;
  a first transconductance stage having inputs and outputs connected to each of the high impedance current paths, comprising:
    a first transconductance amplifier having inputs for differential voltage signals and having outputs for a pair of differential current signals generated from the inputs, the outputs connected to respective first nodes of each of the high impedance current paths, a second transconductance amplifier having inputs for differential voltage signals connected to respective second nodes of the each of the high impedance current paths and having outputs for a pair of differential current signals connected to respective outputs of the first transconductance amplifier, wherein inputs of the second transconductance amplifier are outputs for the differential amplifier system;
  a second transconductance stage having inputs for an average of the system outputs and for a reference voltage and having an output for a current generated therefrom, the generated current input into each of the high impedance current paths; and
  a compensation circuit comprising capacitive elements connected to the pair of high impedance current paths and connected to the output of the second transconductance stage, the capacitive elements having a value.

* * * * *